Figures 1, 1A:
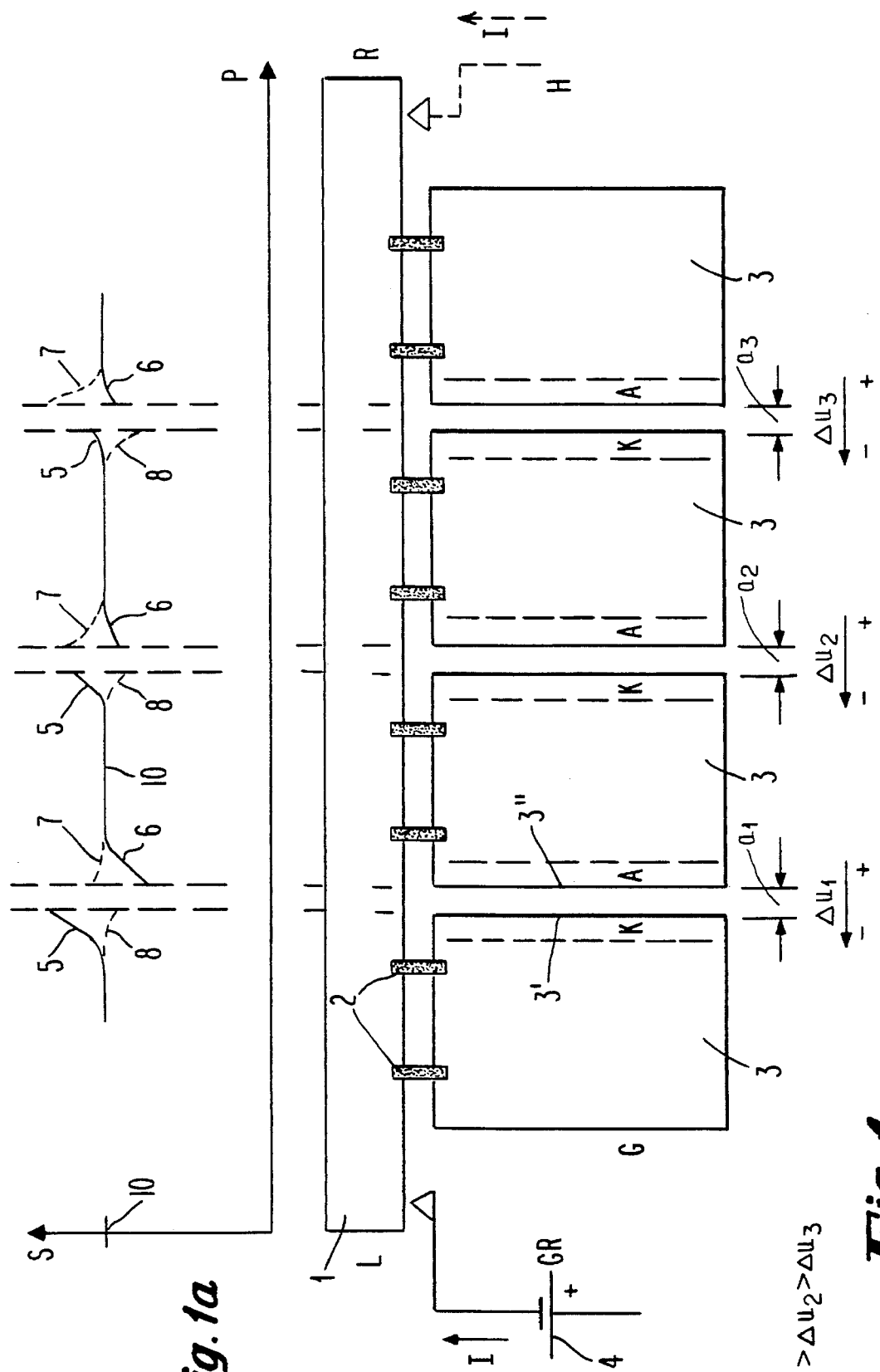

United States Patent [19]

Hübel

[11] Patent Number: 5,558,757
[45] Date of Patent: Sep. 24, 1996

[54] PROCESS FOR IMPROVING THE COATING OF ELECTROLYTICALLY TREATED WORK PIECES, AND ARRNGEMENT FOR CARRYING OUT THE PROCESS

[75] Inventor: Egon Hübel, Feucht, Germany

[73] Assignee: Atotech Deutschland GmbH, Berlin, Germany

[21] Appl. No.: 256,231

[22] PCT Filed: Dec. 22, 1992

[86] PCT No.: PCT/DE92/01086

§ 371 Date: Jun. 29, 1994

§ 102(e) Date: Jun. 29, 1994

[87] PCT Pub. No.: WO93/13248

PCT Pub. Date: Jul. 8, 1993

[30] Foreign Application Priority Data

Dec. 31, 1991 [DE] Germany .............. 41 43 247.9

[51] Int. Cl.$^6$ .............. C25D 17/00; C25D 21/12
[52] U.S. Cl. .............. 205/96; 204/228; 205/128; 205/145
[58] Field of Search .............. 205/96, 128, 145; 204/228

[56] References Cited

U.S. PATENT DOCUMENTS 2,558,090  6/1951  Jernstedt .................. 204/205
3,880,725  4/1975  Ven Raalte et al. ........ 204/15
4,184,927  1/1980  Takahashi et al. ......... 204/33

OTHER PUBLICATIONS

Patent Abstracts of Japan, vol. 12, No. 365, C–532, 29 Sep. 1988.

Primary Examiner—John Niebling
Assistant Examiner—William T. Leader
Attorney, Agent, or Firm—Paul & Paul

[57] ABSTRACT

The invention starts with a process for improving the electrolytic coating of work pieces (3) that are arranged one after the other as a row at a distance from each other on cathode rails (1) or on cathode frames in a bath, whereby the cathode treatment current (I) of the rail or the frames runs parallel to the direction of the above mentioned series of work pieces (3). In order to prevent the large differences in layer thickness in the edge area of adjacent work pieces, e.g. circuit boards, that occurs with the state of the art, without having to go to disadvantageous effort to decrease the voltage drop in the cathode rail or a corresponding frame carrier rod (63), it is provided that the direction of the cathode current flow (I) at least in the cathode rail (1) or the cathode frame carrier rod (63) is changed at least once during a treatment process. This may be done by initially supplying current to a first end of the cathode rail or carrier rod and then switching the current supply location to the opposite end. The invention also relates to an arrangement to carry out this process. Switching may be accomplished by electromechanical reversing switches or electronic d.c. current source switching means.

18 Claims, 10 Drawing Sheets

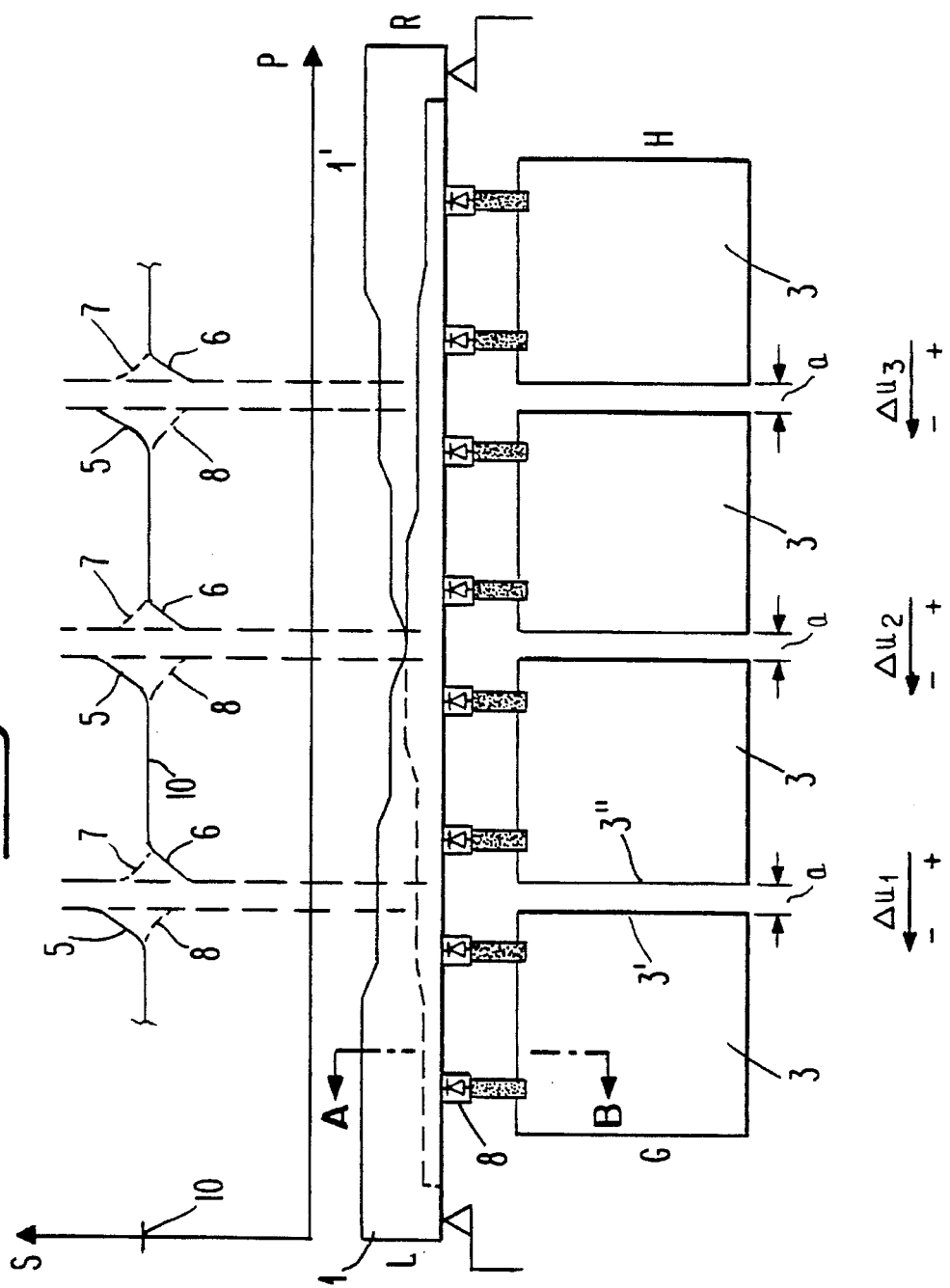
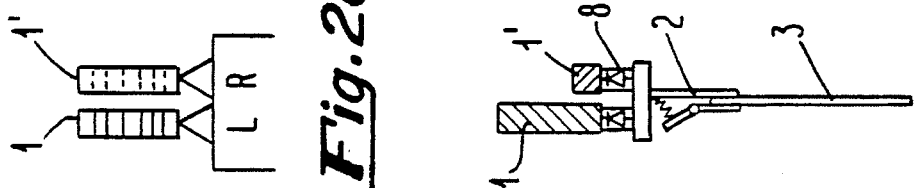

PROCESS FOR IMPROVING THE COATING OF ELECTROLYTICALLY TREATED WORK PIECES, AND ARRNGEMENT FOR CARRYING OUT THE PROCESS

The invention relates first to a process for improving the electrolytic coating on work pieces that are arranged in a row at intervals on cathode rails or cathode frames in a bath, whereby the cathodic treatment current runs in the rail or the frame parallel to the direction of the above mentioned row of work pieces. In practice, the cathodic rails are mainly brackets for articles on which the work pieces are clamped (in particular the concept is plate-shaped work pieces) like circuit boards. In this process, the row of work pieces runs horizontally corresponding to the arrangement of the brackets for articles. Such work pieces can also be clamped on carrier rods of frames, which extend vertically into the bath. The electrolytic treatment current, in particular the concept is a galvanizing process, i.e. a galvanizing current, is conducted to the work pieces to be treated via the brackets for articles or via the carrier rods of the frame. In addition, in the bath, anodes that supply the anode current are mounted on carriers or rods. The metal of the anodes is precipitated on the articles in a known way by the electrolytic procedure. The cathode current creates a voltage drop in its flow direction on the cathode rail or the corresponding frame carrier rod. The magnitude of the voltage drop depends both on the size of the current as well as the specific ohmic resistance per length unit of the cathode rail or of the frame carrier rod. In this way, a corresponding voltage drop results between the fastening point of a work piece on the cathode rail or the frame carrier rod up to the fastening point of the next work piece in the series. Of the opposing edge areas of two adjacent work pieces separated by a space, one acts as a local anode and the other like a local cathode with a cell voltage, i.e. like a partial electrolytic cell. The result of this is that the edge area of the cathode function gets more metal coating than the anodic edge area. During measurements, 20% and more differences were determined between the respective metal coatings. In order to eliminate this disadvantage, there could be an attempt to decrease the voltage drops along the cathode rail or corresponding frame carrier rods. To do this, for example, a decrease in the galvanizing current density, i.e. the currents in the rails and/or increase of the rail material conductivity or frame carrier rod material and/or an increase in the cross sections of the cathode rails or the frame carrier rods have been attempted. Each of these variations has disadvantages. The decreased current density requires longer galvanizing times, i.e. the system is not as economical. To increase the conductivity, in fact, copper can be used as a material. Still copper has a tendency to severe corrosion in the galvanizing technology or electrolytic bath environment, which leads to additional, uncontrolled and high voltage drops both at the anode contacts as well as at the work piece contacts. The above mentioned corrosion is not present with stainless steel so this material is preferably used to prevent corrosion. However, the disadvantage of a specific resistance that is 40 times higher compared to copper has to be taken into consideration. Increases in the cross section are in general not possible, and especially with stainless steel because of the high specific weight. Relatively high material costs also occur because of this. Instead of this, a two-sided contact of the anode and cathode rails has been planned. In fact this reduces the voltage drops on the rails by half, but simultaneously causes new uncertainties in the overall system. The anode and cathode rails can be lifted out, i.e. the current reaches these rails by contact. In practice, these contacts get dirty and corrode until complete failure of one side. This is not recognized by the system because the remaining second contact takes over the entire current. The result in turn is non-permissible high voltage drops on the rail. Monitoring the contacts is also not possible for cost reasons. In addition, arrangements are known in which the anode rails are contacted on one bath side and the cathode rail on the opposite bath side (opposing supply). This process does not have the contact problem explained above. The voltage drops compensate each other in a limited scope with regard to the cell voltage that is effective for the galvanizing. However, the magnitude of the voltage drops on the rails is not affected by this at all.

The tasks and/or problems of the invention consist of preventing the large differences in layer thickness described in the edge area of adjacent work pieces, e.g. circuit boards, without having to undertake disadvantageous efforts to decrease the voltage drop in the cathode rail or a corresponding frame carrier rod.

To solve this task and/or problem, it is first provided that the direction of current supply is changed repeatedly during the treatment process at least in the cathode rail or the cathode frame carrier rod. For example, over a total treatment time of 60 minutes, the cathode current can be supplied for 5 minutes from one side, then 5 minutes from the other side and after that 5 minutes again from the first side, etc. This alternating supply of the cathode current from both sides has the effect that the polarity of the voltage drops and thus the voltage on the edges of the work pieces lying opposite each other is reversed. As a result of this, the edge areas of two work pieces that lie opposite each other at a distance like this get a higher and then a lower metal application alternately. This basically evens out so that in total, after a treatment process, each of these two edge areas has about the same metal coating thickness.

In practice, the invention results in the special advantage that the cathode rail and the frame carrier rods operated as cathodes can be manufactured from stainless steel, which is not sensitive to corrosion, without having the danger that the greater resulting voltage drop will lead to non-uniform metal coatings that can not be tolerated on the edge areas of the work pieces that lie opposite each other.

The characteristics of the present invention result in advantages in the absolute layer thickness distribution over the length of the brackets for articles or the frame carrier rods.

The characteristics of the present invention also contribute to making the voltage drops uniform on a cathode rail or a frame carrier rod operated as a cathode on one side and anode rails on the other side.

The characteristics in of the present invention further prevent interruptions in the current flow during the change in current direction which under certain circumstances can lead to damaging effects on the metal coating.

In addition, the present invention provides contain two alternative process measures to achieve the change in current supply direction either with switching measures or means and a one-cell bath or without special switching measures or means, but the use of a multi-cell bath.

The invention is also based on the task and/or problem of creating arrangements to carry out the procedure according to that set forth above. First, the present invention provides an arrangement for this, to carry out the process according to that earlier recited.

In addition, the present invention provides contain several advantageous embodiments of the arrangement according to the present invention.

Figure 2C:
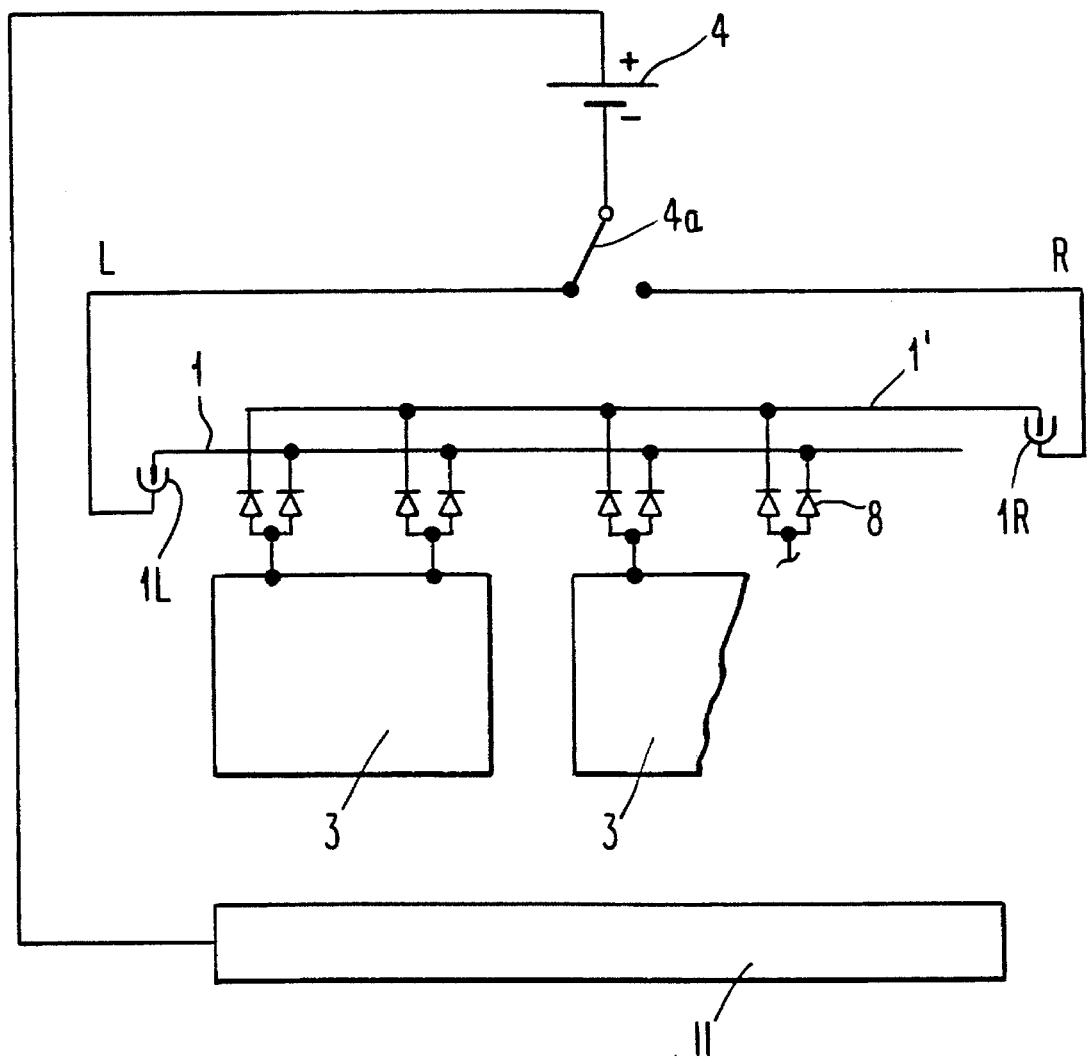
Figure 3:
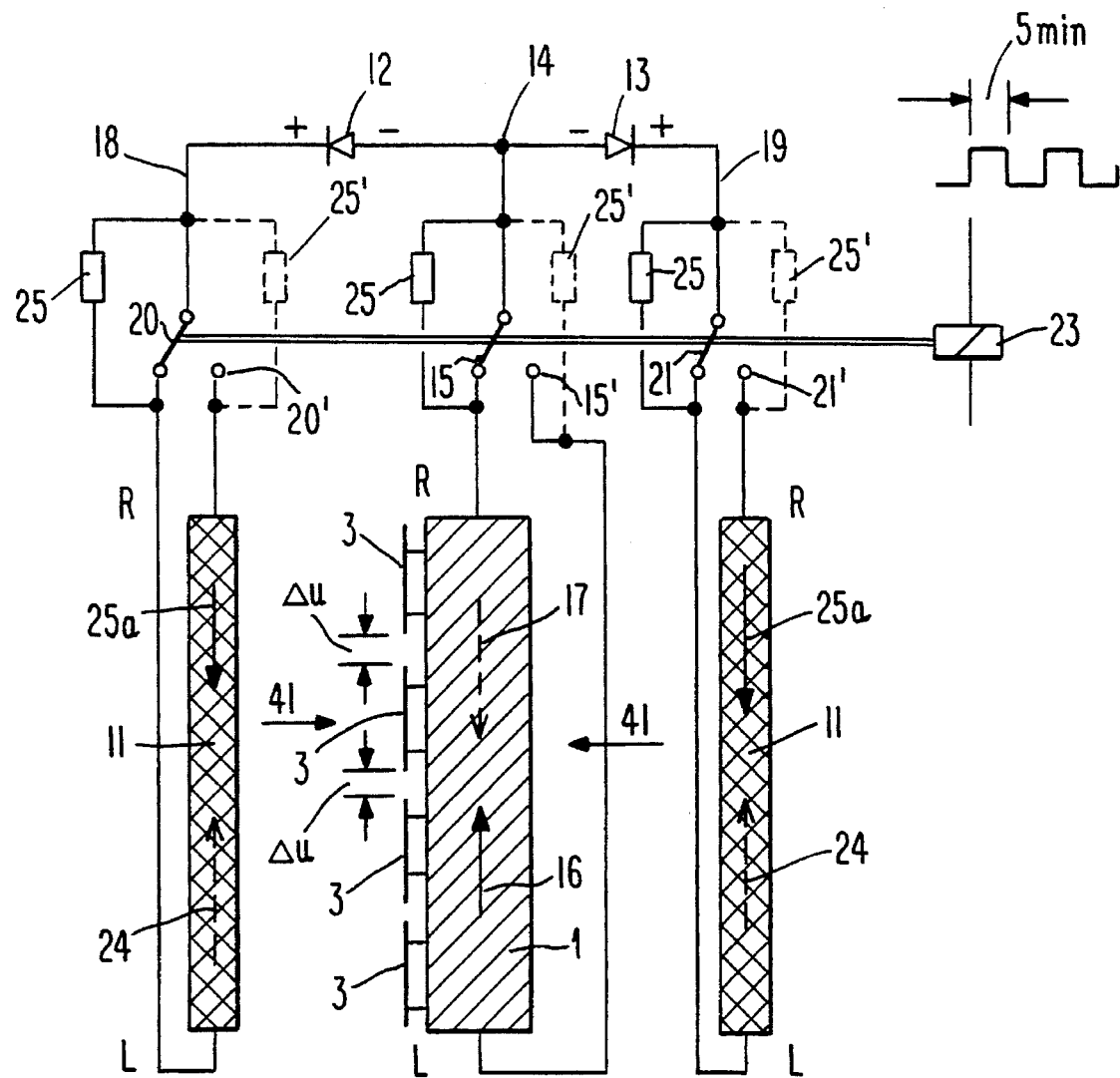
Figure 4:
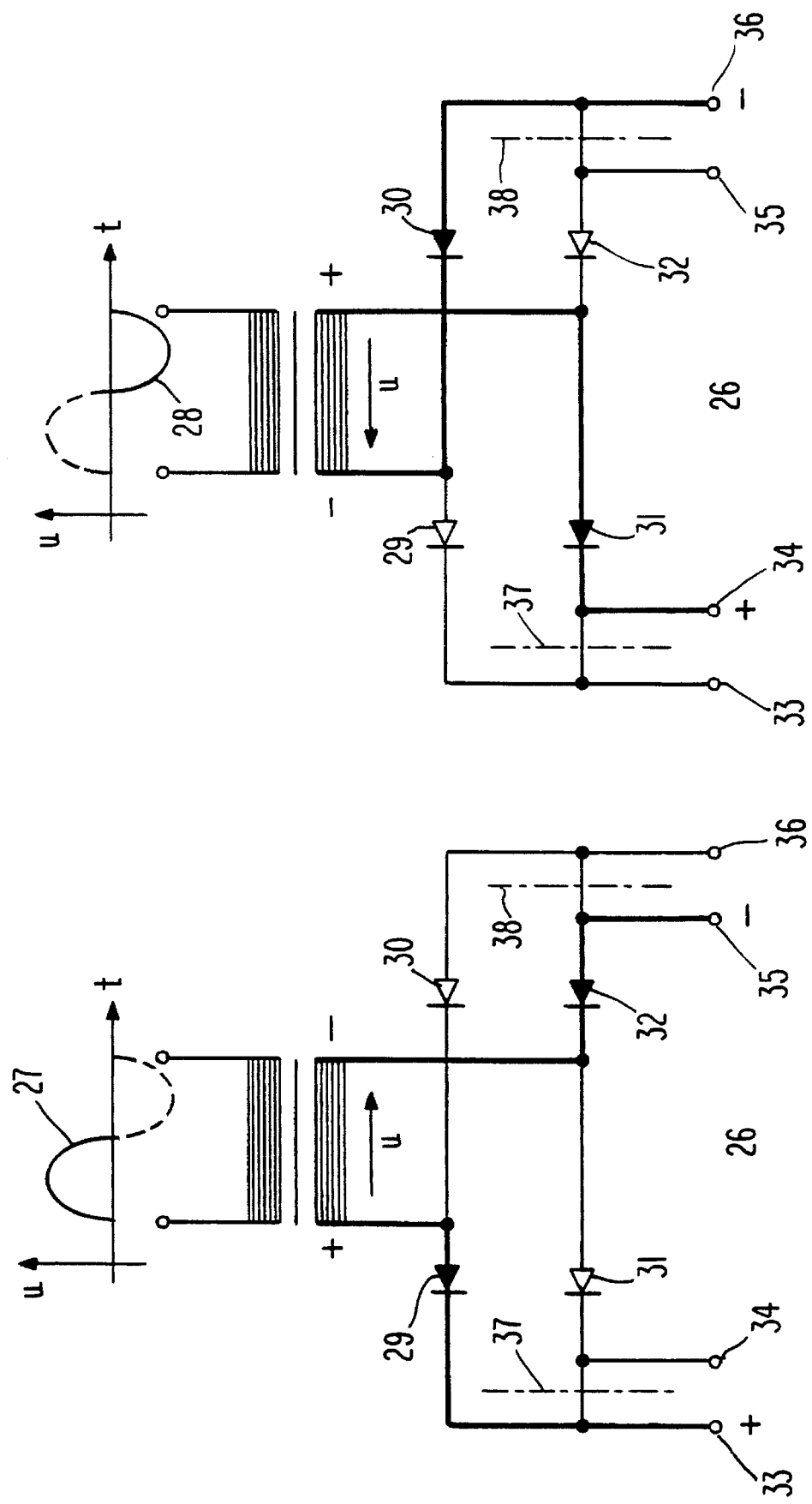
Figure 5:
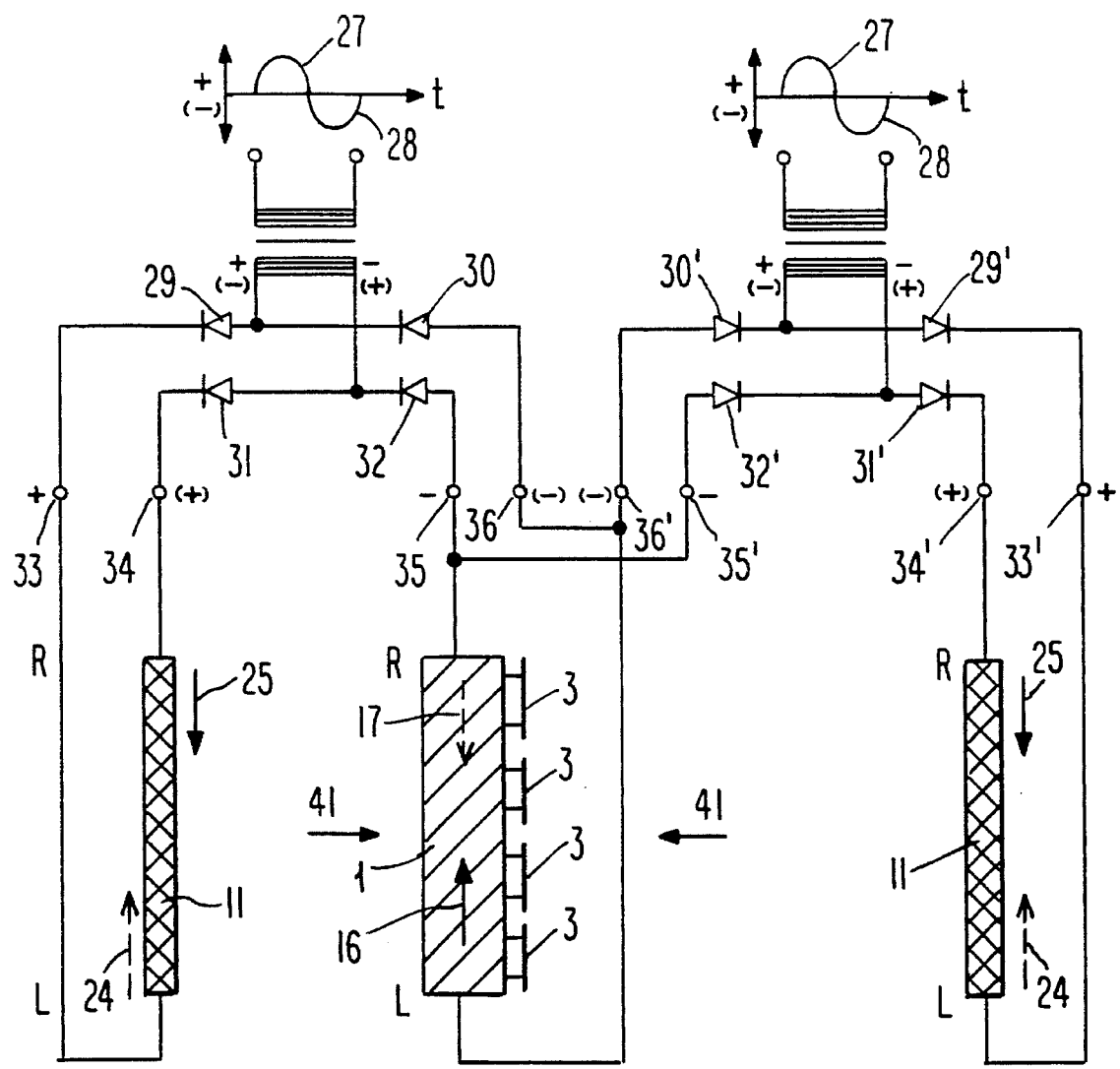
Figure 5A:
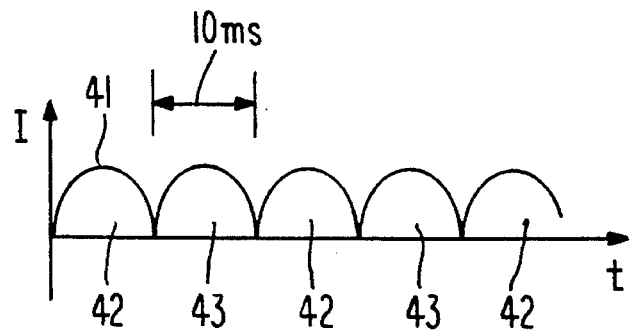
Figure 6:
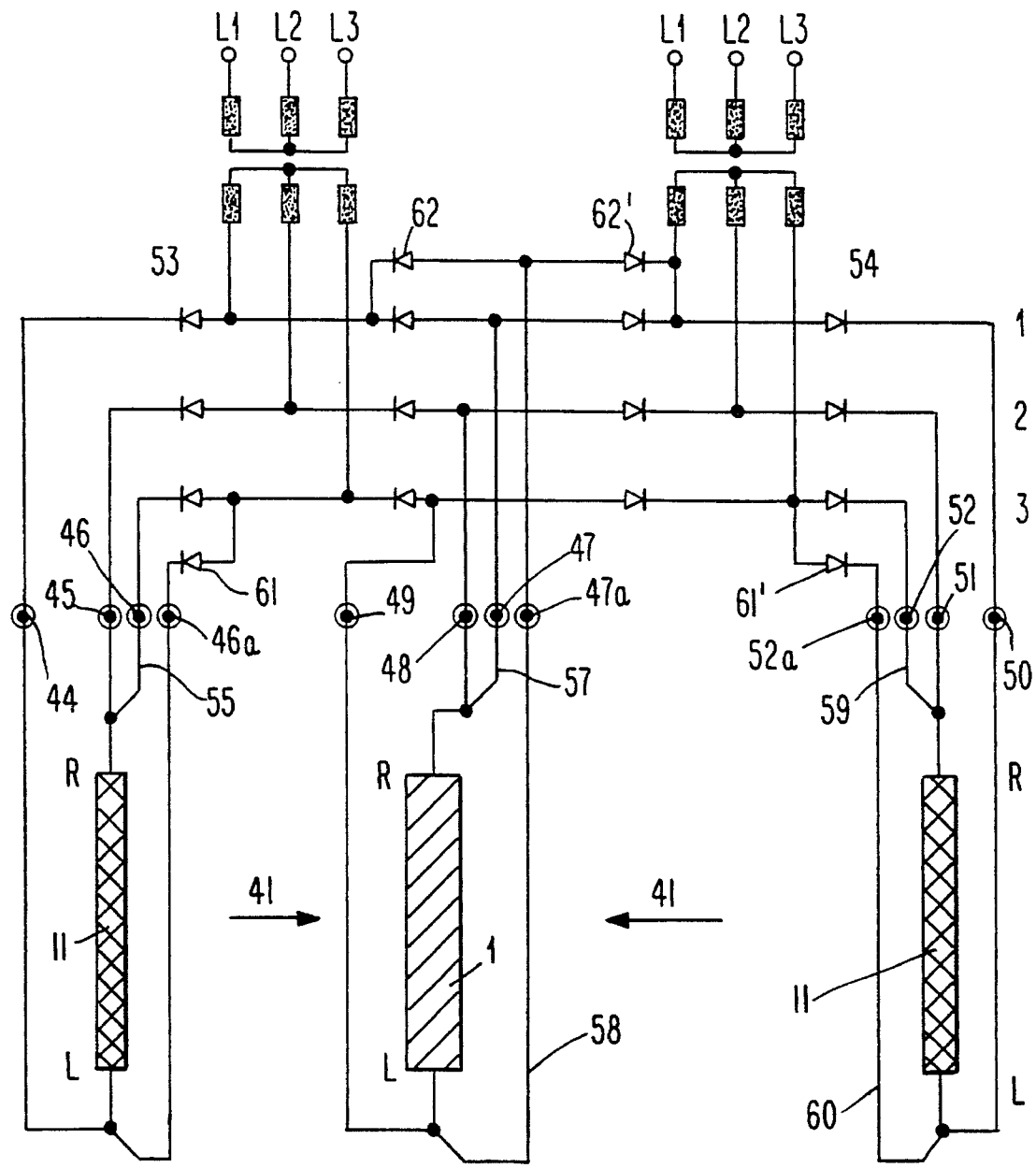
Figure 6A:
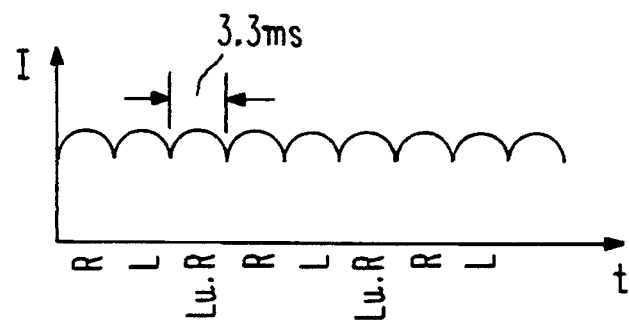
Figure 7:
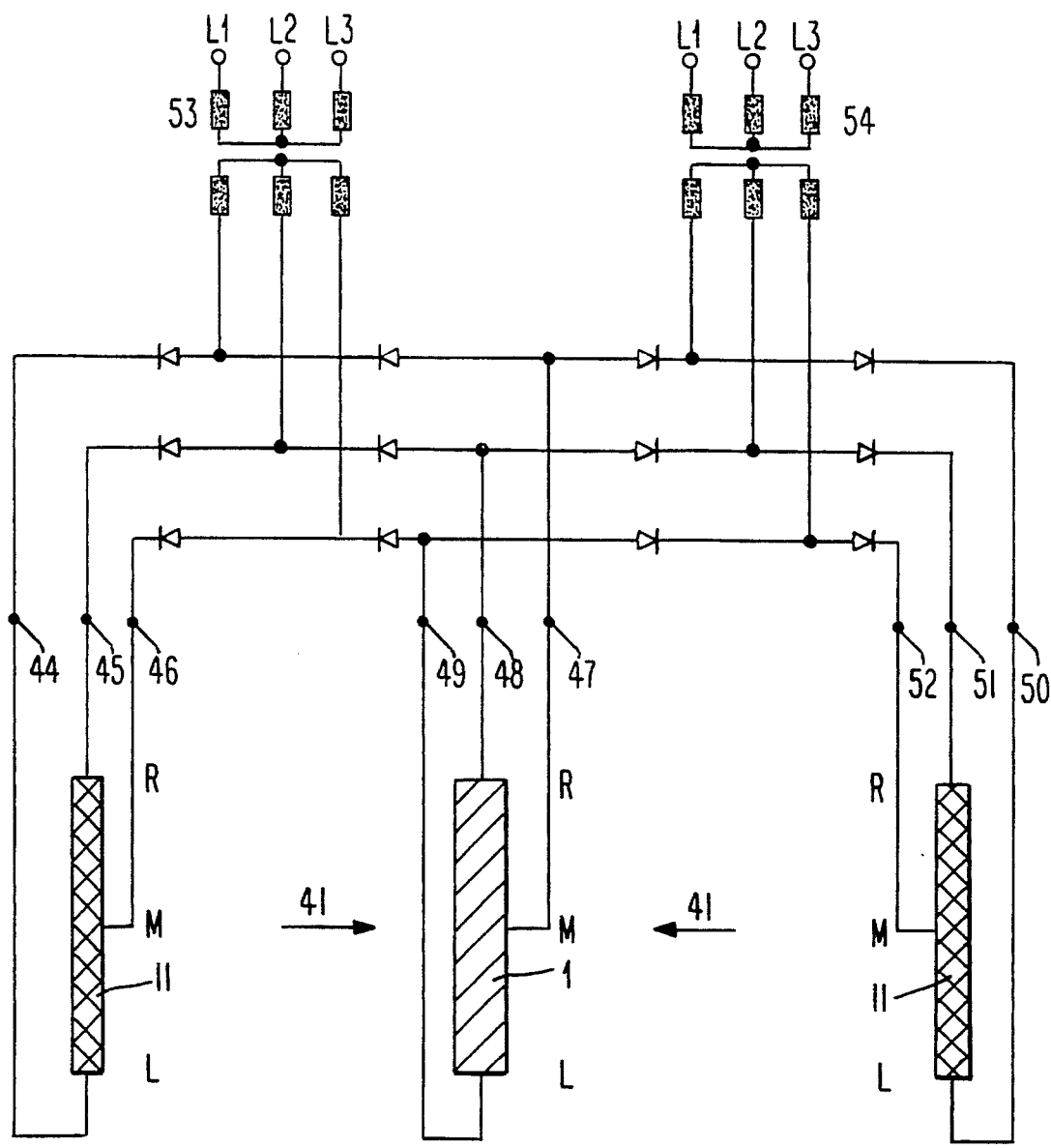
Figure 7A:
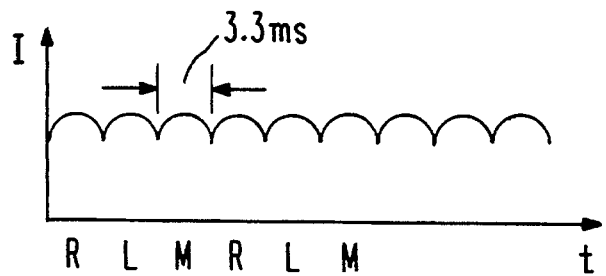
Figure 8:
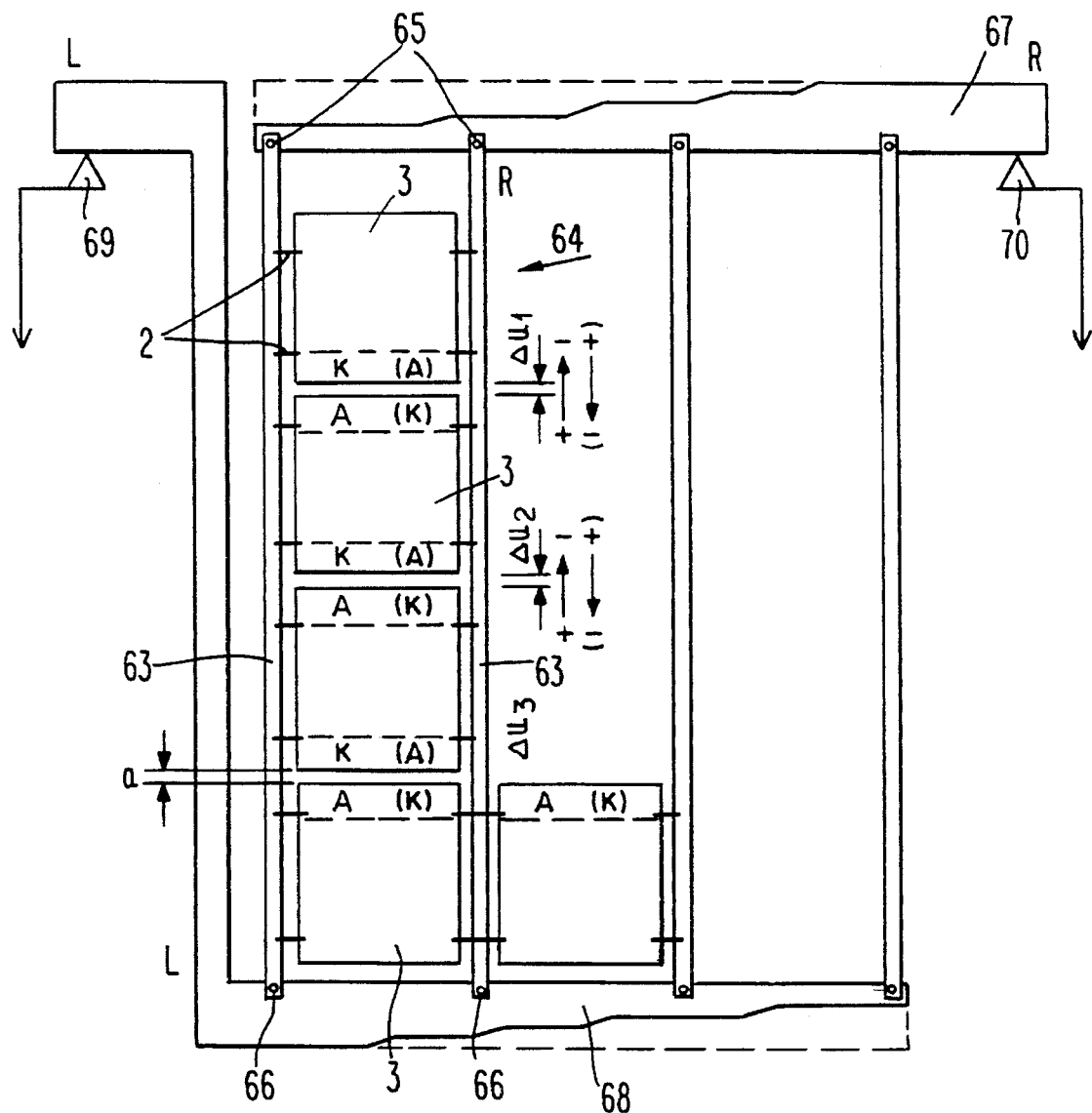
Figure 9:
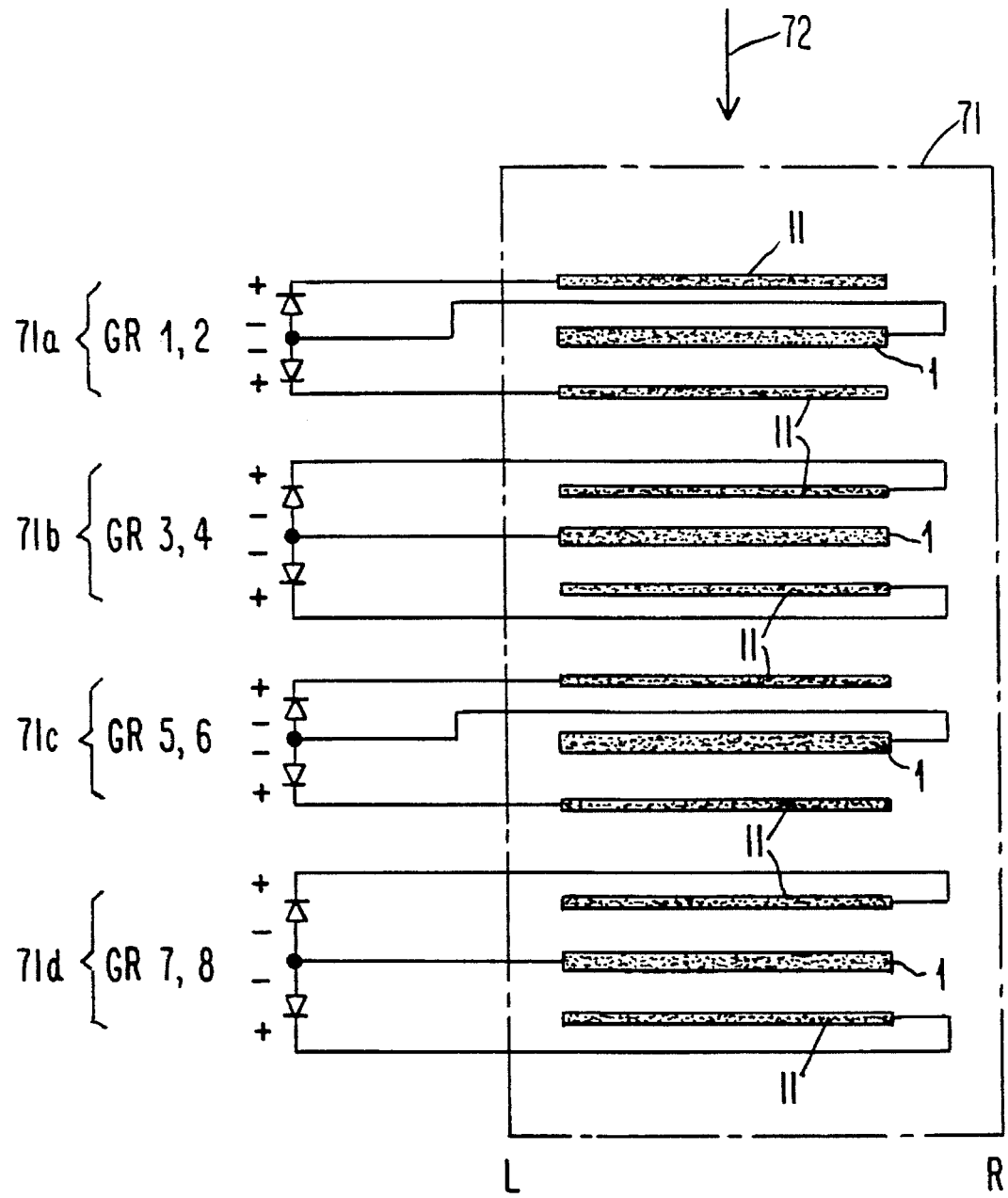

Reference is made to the content of the claims that were specified only in key words above for elucidation of the invention. Additional advantages and characteristics of the invention are to be found in the following description and the accompanying drawing of implementation variations according to the invention. In the drawings, which are basically schematic, the following are shown:

FIG. 1: a first embodiment of the invention principle in side view,

FIG. 1a: a diagram of the layer thickness applied over the length of the treatment area, applied with the version according to FIG. 1, FIG. 2 to 2c: another embodiment of the principle of the invention in side view, FIG. 2d: a diagram of the layer thickness over the area of treatment that belongs to the example according to FIG. 2–2c, FIG. 3: a wiring diagram of an embodiment of the direct current generation of the invention with rails represented schematically, FIG. 4: the basic representation of a circuit used here to supply the current, FIG. 5 and 5a: the circuit and accompanying rails of a practical version of the circuit principle according to FIG. 4, FIG. 6 and 6a: another embodiment of the invention with wiring diagram and rails, FIG. 7 and 7a: another embodiment of the invention, FIG. 8: an embodiment of the invention with frame carrier rods, FIG. 9: another version of the invention in which the articles are placed in various bath stations.

FIG. 1 shows work pieces, here in the form of plates 3 with clamps 2, that are fastened so that they can be removed on a cathode rail 1, whereby the concept particularly involves circuit boards. From the direct current source 4, the cathode current is supplied either on the end L shown in the left side of the drawing, and/or as indicated in dotted lines, at the end R of the cathode rail 1 shown on the right side of the drawing. In the case of the supply L shown with solid lines, the cathode current flows through rail 1 from L in the direction of R. Because of this a voltage drop occurs on the rail, whereby the voltage drops $\Delta U1 > \Delta U2 >$ and $\Delta U3$ form between work pieces adjacent to each other, which exist at the edges 3', 3" of the work pieces 3 that lie opposite each other. The above mentioned edges 3', 3" are at distances a1, a2, a3 from each other. In practice, distances a1, etc. are to be kept relatively small, because otherwise the areas marked with "K" and "A" of the edges 3', 3" lying opposite each other at a distance will have thick spots due to the metal deposit, i.e. the so-called "dog bone effect." If the cathode current now flows from L in the direction of R, the voltage drops $\Delta U$ are now present locally with their polarity as specified. Because of this a negative voltage exists in edge area "K" in comparison to the opposite edge area "A", whereby the ions coming from the anode precipitate more in the "K" areas, i.e. form there (according to FIG. 1a) a thicker metal coating 5, which on the other hand results in a decreased metal application 6 on the corresponding "A" areas. In FIG. 1a, the ordinate indicates the relative layer thickness S and the abscissa P the respective position along rail 1. In this process, the size of the additional metal coating decreases in the direction from L to R, since in this direction, the above mentioned voltage drops $\Delta U1$ etc. also decrease, since partial currents discharge over the work pieces 3 in the current flow direction. If the cathode current is now supplied at R (dotted lines), i.e. it changes its flow direction in rail 1, then $\Delta U 3 > \Delta U 2 > \Delta U 1$ with simultaneous reversal of the polarity of these voltage drops with the result that the increases 7 (indicated with dotted lines) in the metal application on the edge areas "A" and the decreased applications 8, also shown in dotted lines, result in edge area "K". In this case, the size of the increases 7 and the decreases 8 decrease from R to L. In other words: the alternating supply of the cathode current from the ends L and R of the cathode rail causes a change in the effective direction of the voltage drops $\Delta U$ and thus a reversal of the areas of increased or decreased metal application. This change in current direction in rail 1 can be repeated, at least according to the principle of the invention, the cathode current must flow from L in the direction of R and after that over about the same length of time from R in the direction of L. The increased or decreased coatings 5 to 8 basically compensate each other, i.e on the edge areas "K" and "A" metal coatings that are about equal to each other develop, which also correspond to about the thickness of the metal applications in the remaining area of the work pieces 3. The average layer thickness is indicated with 10. FIG. 2 shows a variation of the invention, in which two cathode rails 1, 1' are provided, the cross section of which decreases in the current flow direction L to R in the cathode rail 1 and from R in the direction of L in the cathode rail 1'. In this context, reference is made in detail to the object of the older German patent application P 40 41 598.8–45 granted on Jun. 25, 1992, from the same applicant and its disclosure content is taken into consideration. In this, FIG. 2a shows a view toward the rail ends from the end R, FIG. 2b a cross section along line A–B in FIG. 2, FIG. 2c the arrangement according to FIG. 2 as a diagram, and above all shows the electrical connections, and FIG. 2d shows the diagram of the thickness of the metal layer applied over the length of the treatment area. Decoupling diodes 8 are provided between the work pieces 3 and the cathode rails 1, 1' (see in particular FIG. 2c), the decoupling diodes preventing current from flowing from one to the other cathode rail 1 or 1'. The differential voltages $\Delta U1$, $\Delta U2$ and $\Delta U3$ are about equal to each other. FIG. 2c shows the direct current source 4 and a switch 4a, as well as the rail contacts 1L and 1R in the area of ends L, R. However, only the switch 4a for the cathode rails 1, 1' is shown. The anodes are indicated purely schematically with 11. FIG. 2d shows the metal applications 5 to 8 analogous to FIG. 1a again. Reference is made to the corresponding versions in FIG. 1a. However, in this case, there is a difference between the size of coatings 5 to 8 in the example of FIG. 1, 1a on one hand and that in FIG. 2, 2a on the other hand, that in the latter named example the absolute amounts of the metal coatings 5 to 8 do not change in the direction from G to H or vice versa. This results from the angled cross sections of rails 1, 1', whereby a uniform voltage drop per length unit is set over the entire length. In this way, the absolute dimension of the voltage drops $\Delta U$ that are applied on opposite edges 3', 3" of the work pieces has no influence on the effect of the invention since this is compensated by the alternation of the current flow direction.

The embodiment in FIG. 3 shows a cathode rail 1 with the work pieces 3 hanging below the rail. The cathode rail 1 and/or the cathode rails 1, 1' in the embodiment in FIG. 2 can have the function of article carriers according to these examples of the invention. The differential voltage $\Delta U$ explained in FIGS. 1 and 2 is indicated, including one of the distances a. In addition, two anode rails 11 carrying the anodes are shown. The direct current source consists here of two rectifiers 12, 13 that come together with their negative sides at position 14 and are alternatively applied to the end R or the other end L of the cathode rail via a reversing switch 15. In this way, the cathode current here can also flow according to the arrow 16 shown with a solid line from L in the direction of R or according to arrow 17 shown with a dotted line in the reverse direction from R to L. The positive poles or connections of rectifiers 12, 13 are supplied via wires 18, 19 to reversing switches 20, 21, in order to optionally connect the ends L or the ends R of the anode rails 11 to the positive side and thus the side supplying the anode current. The reversing switches 15, 20 and 21 are linked to each other, e.g. by means of direct current contactor 23. In the switching position shown of reversing switches 15, 20, 21 the cathode current 17 shown with dotted lines and the anode current 24, also shown with dotted lines, flow. If the other switching position of reversing switches 15, 20, 21 is effected via the direct current contactor, the current in the cathode sail 1 flows according to the direction shown with arrow 16 (indicated with solid lines) and in the anode sails 11 of the anode current in the direction of arrows 25*a* also indicated with solid lines. In fact, the direction of current flow in the anode rails has no effect on the metal applications in edge areas "K" and "A" explained using FIGS. 1, 2. However, according to the state of the art explained at the beginning and also according to the specified older application P 40 41 598.8–45, this direction of current flow in the anode rails and the cathode rail has a favorable effect on the voltage drops occurring in rails 1, 11 and thus on the effective galvanizing voltage.

Above the direct current contactor 23, its switching in a cycle of e.g. five minutes is shown schematically, i.e. the direct current contactor holds the reversing switches 15, 20, 21 five minutes in the position shown, then switches to the other position (contacts 20', 15' and 21'), whereby this position is held five minutes again. Then there is reverse switching to the first-named positions 15, 20, 21, etc. until the end of the treatment time is reached.

In order to prevent a complete interruption of current during the reverse switching, the resistors 25 and 25' are provided. However, instead of the electromechanical switch 23, electronic switches with significantly higher switching frequencies and faster bath current regulation can be used. In this process, the switching can also be achieved by a time offset which completely prevents current interruptions, in that, for example, first the anode 11 on the front side, shown on the left in FIG. 3, is switched as shown for a current supply from L to R; a few milliseconds later the cathode rail is switched from R to L and after a few milliseconds the anode rail on the back side is switched from L to R. In this process, the sequence of the above named switching is irrelevant in practice.

Instead of using mechanical or electronic reversing switches, the invention can also be implemented with arrangements that work either with different rectifier bridge-connected circuits (FIG. 4 to FIG. 7) or with the use of an arrangement of several bath stations.

In the examples in FIGS. 4 and 5, FIG. 4 shows the electrical principle and FIG. 5 the practical version that goes with it. FIG. 4 shows one and the same bridge-connected rectifier 26 during processing of a positive half wave 27 (left illustration) and a negative half wave 28 (right illustration) of the network voltage U. Diodes 29 to 32 and outgoing direct current outputs are provided in the form of connections 33 to 36. In the case of the positive half wave 27, the current flows over diodes 29, 32, i.e. the connections 33 to 34 are positive and the connections 35 to 36 are negative. In the case of the negative half wave 28 (right illustration) the current flows via diodes 31, 30 so that the connections 34 to 33 are positive and the connections 36 to 35 are negative. In these illustrations, the current conducting paths are drawn with thick lines and the non-current conducting paths are drawn with thin lines. In the above view of FIG. 4, it is not a matter of two separate rectifiers, but the same bridge-connected rectifier (also called Graetz circuit), but in various operating stages. If we now separate these bridge-connected rectifiers at the separating points 37, 38, four outputs that are separate from each other result (33, 34, 35, 36). With positive network half wave 27 in FIG. 4, the outputs 33 lead to the positive pole and 35 to the negative pole while the outputs 34 and 36 do not carry current. With the negative network half wave 28, the outputs 34 supply the positive pole and 36 the negative pole while outputs 33 and 35 do not carry current. If two separate rectifiers 39 and 40 of this type are connected to the anode rails and the cathode rail of an electrolytic bath, an arrangement results made according to FIG. 5 in the practical version with two separate rectifiers 39, 40. The two positive outputs 33, 34 and the two negative outputs 35, 36 are provided. The diodes and connections shown there have the same numbering as in FIG. 4, however, the diodes and connections of the second rectifier 40 are indicated with a quotation mark. In addition, on the left the front side anode rail 11 is shown, in the center the cathode rail 1 with articles 3 and to the right of that the rear side anode rail 11 is shown. If the rectifies corresponding to FIG. 5 are now connected to the anode rail and the cathode rails, these rails are supplied, alternately each half wave, from one side and from the other side with bath current of the same polarity. The bath current supply according to FIG. 5, which according to the above mentioned versions operates with a separate single phase bridge-connected rectifier arrangement on the front and rear side of the work pieces, has instead of the three connections that are otherwise usual with two rectifiers (see FIG. 3) a total of 6 connections because of the separation of the bridge-connected circuits. These are connected to the anode and cathode rails according to FIG. 5 such that the same effect occurs for voltage U as is described in detail using FIG. 3. Only in the preceding case of FIG. 5, the "switching speed" is dependent on the network frequency, i.e. it is significantly higher. At a network frequency of 50 Hz, the supply side (L, R) changes every 10 ms. However, as explained above, and which is very important to the principle, the polarity of the bath current remains the same for the rail affected. Further details that have to be explained for FIG. 5 is the fact that in the case of the positive wave 27 of network voltage U is shown without brackets and in the case of the negative wave 28, the network voltage U is shown with brackets. So with the "–" designation on connection 35 during positive half wave 27 of the network voltage these is a cathode current flow from R in the direction of L (arrow 17) and, in the case of the second negative half wave 28 of the network voltage U via the connection 36, a cathode current flow according to arrow 16 results. Correspondingly, the current directions and connections of the anode rails result according to arrows 24, 25 analogous to FIG. 3.

In FIG. 5 and also in FIG. 3, the direction of the bath currents is indicated with 41. The path of these bath currents is shown in the diagram in FIG. 5*a*, whereby the number 42 indicates a supply from L and the number 43 a supply from R.

In these separate rectifier bridge-connected circuits there is the great advantage that no additional switching arrangements are required. The "switching" proceeds under network control, i.e. the control or regulation is done by the current network with its frequency and phase position in the rectifier arrangement with the diodes present. Because of the very fast cycle time (10 ms at 50 Hz) of the "switching" an especially good uniformity of the metal coating can generally be achieved. The migration rate of the metal ions in the electrolyte on one and the fast "switching time" on the other hand lends an additional dynamic to the electrolytic bath. A monitoring of the contacts of the anode and cathode rails is necessary in critical applications under certain circumstances, which can be implemented technically by a comparison of the currents in the individual paths.

A three-phase bridge-connected rectifier shown in FIG. 6 is recommended at higher powers (bath currents) or even with the interfering influence of the relatively large ripple of a single-phase bath current supply shown in FIG. 5a. Even with this three-phase bridge-connected rectifier, by separation of the current paths, appropriate direct current outputs occur in the form of connections (in the present case twelve connections 44 to 52a). In this case, the connections 45, 44 supply to the ends R, L of the front anode rail shown on the left; the connections 48, 49 to the ends R, L of the cathode rail 1 and the connections 51, 50 to the ends R, L of the rear side anode rail 11 shown on the right. The connections 46, 47 and 52, 46a, 47a, 52a each lead to the ends R, L of the rails 11, 1, 11. The rectifier 53 supplies the anode rail 11 shown on the left from its positive poles 44, 45, 46 and 46a and the cathode rail 1 from its negative poles 47 and 47a, 48, 49. The time sequence of the switching is carried out as follows by the three-phase current, corresponding to FIG. 61:

Left anode rail 11 (FIG. 6)

Voltage L1-L2 Positive pole 44 to L

Voltage L2-L3 Positive pole 45 to R

Voltage L3-L1 Positive pole 46 and 46a to L and R

Cathode rail 1

Voltage L1-L2 Negative pole 48 to R

Voltage L2-L3 Negative pole 49 to L

Voltage L3-L1 Negative pole 47 and 47a to L and R

The rectifier 54 supplies the anode rail 11 shown on the right from its positive poles 50, 51, 52 and 52a and the cathode rail 1 from its negative poles 47 and 47a, 48, 49 which are identical to the negative poles of the rectifier 53. The time sequence occurs analogously to that specified above. What is important is that the two rectifiers 53, 54 are connected to the network in such a way that their comparable direct current outputs are supplied from the same network phase. This means, if for example 44 is conducting current, than output 50 must also conduct current. Or if supply is from the rectifier 53 via 48, the rectifier 54 must also simultaneously supply via 48. This causes synchronous switching of the supplies in the rails. The third direct current output is thus connected to wires 55, 56 at the ends R, L of the front anode rail 11, to wires 57, 58 at the ends R, L of the cathode rail 1 and to the wires 59, 60 at the ends R, L of the reverse anode rail 11. So for the front anode rail 11 shown on the left and the cathode rail 1, the following apply Voltage L1-L2 supplies+at L from 11 and–at R from 1, Voltage L2-L3 supplies+at R from 11 and–at L from 1, Voltage L3-L1 supplies+at R and L from 11 and–at R and L from 1.

With such three-phase current supplies, two phases are thus effective, i.e. two thirds of the three-phase current completely in the sense of the invention. In the time when the third phase is effective, the voltage drops are reduced by half in the rails because of the current distribution, so the third phase reduces the error to 50%. This also achieves a reduction of the layer thickness area in edge areas A, K of the work pieces. The advantage of a better, i.e. more uniform wave of the resulting bath current 41 is achieved (see illustration in FIG. 6a). In this case, the corresponding supply and the duration of 3.3 ms of the active wave part are illustrated below each wave affected and namely, as applies to 50 Hz network frequency.

In comparison to the following embodiment in FIG. 7 that is explained below, the version according to FIG. 6 requires only additionally the diodes 61, 62, 61', 62'. There are parallel diodes to the corresponding rectifier diodes.

The embodiment according to FIG. 7 is the same as the example in FIG. 6 with respect to the three-phase current bridge-connected rectifier, so that reference is made first to that explanation. In contrast to FIG. 6, however, connections 46, 47 and 52 each supply to the middle M of rails 11, 1, 11. So for example, on the anode rail 11 this results in an anode side supply of phase 1 from rectifier 53 via the connection 44 to L, of phase 2 via connection 45 to R and of phase 3 via the above named connection 46 to M with simultaneous supply from the rectifier 53 to the cathode rail 1 of phase 1 via connection 48 at R, of phase 2 via the connection 49 at L and of phase 3 via the connection 47 at M. The rear side supply of the anode rail 11 shown on the right occurs analogously (as explained above).

The rectifier 53 thus supplies the anode rail 11 shown on the left from its positive poles 44, 45, 46 and the cathode rail 1 from its negative poles 47, 48, 49.

The time sequence of the switching is carried out as follows with three-phase current corresponding to FIG. 7a:

Left anode rail 11 (FIG. 6)

Voltage L1 L2 Positive pole 44 to L

Voltage L2 L3 Positive pole 45 to R

Voltage L3 L1 Positive pole 46 to M

Cathode rail 1

Voltage L1 L2 Negative pole 48 to R

Voltage L2 L3 Negative pole 49 to L

Voltage L3 L1 Negative pole 47 to M

The rectifier 54 supplies the anode rail 11 shown on the right from its positive poles 50, 51, 52 and the cathode rail 1 from its negative poles 47, 48, 49, which are identical to the negative poles of the rectifier 53. The time sequence occurs analogously to that specified above. What is important is that the two rectifiers 53, 54 are connected to the network in such a way that their comparable outputs are supplied by the same network phase. This means if e.g. output 44 carrier current, then output 50 must also carry current. Or if supply is from rectifier 53 via 48, rectifier 54 must also supply via 48. The effect of this is synchronous switching of the supplies in the rails. FIG. 7a corresponds to FIG. 6a in the ripple of the current over time. Only instead of the phase data "L and R" given in FIG. 6a, in FIG. 7a "M" is given. FIG. 8 shows that, as explained at the beginning, the problem and solution of the invention can also be used in an arrangement in which the work pieces 3 are clamped on, so that they can be removed, at intervals a over each other on carrier rods 63 of frames 64 (2). The carrier rods 63 have ends 65 and 66, whereby the upper ends 65 in FIG. 8 are connected to a cathode rail 67 and the lower ends are connected to another cathode rail 68. Along the carrier rods 63 voltage drops develop—depending on current flow direction—from top to bottom or from bottom to top (related to the illustration in FIG. 8), which in turn cause voltage drops ΔU at intervals a between the edges of edge areas "A" and "K". According to the invention, the lower cathode rail 68 is applied at 69 or the upper cathode rail 67 at 70 to the negative pole of the direct current source, i.e. they alternately receive the cathode current for a certain period of time. In this way, via the connections 65, 66 (in FIG. 8) cathode currents alternately flowing from bottom to top or from top to bottom result in the carrier rods 63. In the drawings in FIG. 8, in one connection of the negative pole of the direct current source at 69 the polarity entries are valid which have a bracket mark; in contrast to a connection of the negative pole of the direct current source at point 70 with the entries that have no bracket notation. In addition, reference is made to the effect on the version in FIG. 1. The use of the invention with this type of frames is therefore of special importance since these frames can and should be relatively long and in this way the voltage drops can be especially noticeable. Particularly because of the high mechanical strength required, copper can generally not be used; stainless steel has to be used for the carrier rods of this frame. Using the invention, particularly deep baths can be constructed and in spite of this, disadvantageous layer thickness differences can be prevented in the edge areas "K" and "A". As indicated in FIG. 8, several carrier frames can be provided next to each other; in this illustration three carrier frames.

The cathode rails 67, 68 can either, as shown in dotted lines, have a uniform cross section along their length or even have a graded cross section as is shown and explained in the example in FIG. 2–2d.

The use of the invention with carrier frames makes it possible to implement a greater length (depth) with carrier rods of a specified diameter, i.e to make the affected galvanizing system more economical. Correspondingly, more work pieces can be placed on these longer carrier rods, which however increases the magnitude of the current flowing in the carrier rods. The result of this in turn is greater voltage drops ΔU. These voltage drops ΔU that are not permissible in and of themselves are mainly compensated by the alternating supply of the carrier rods from both sides in their effect on the magnitude of the metal layer applied in edge areas "K" and "A" of the work pieces.

The embodiment according to FIG. 9 shows a multi-celled, in this case 4-celled bath 71, the anode and cathode connections of which contact rectifiers GR 1, 2–GR 7, 8 cell by cell in a different current flow direction. The anode rails are each marked with 11 and the cathode rail masked with 1, the ends in turn have the designations L and R. It is assumed that the article carriers approach the system in arrow direction 72 and the articles are first dipped into bath cell 71a, which is supplied by rectifiers GR 1, 2. It can be seen here that in the anode rails 11, the current supply from the positive pole occurs at L and the supply from the negative pole to the cathode rail 1 at its end R. If 50% of the total planned exposure time has expired (treatment time), the articles will be lifted out of cell 71a and introduced into the next cell 71b, which is supplied from rectifiers GR 3, 4. Here the supply directions are exactly reversed, compared to cell 71a. The positive outputs of the rectifier are supplied to the ends R of the anode rails 11 and its negative connection to the end L of the cathode rail 1. In the effect on the layer thickness distribution, this corresponds to the switching according to the invention of the supplies from L to R for the anode rails and from R to L for the cathode rail. However, this is without the use of a reversing switch. At the same time, this very advantageously compensates tolerances from cell 71a and 71b like e.g. non-uniform anode bars, fade-out and shapes that can have an influence on the quality of the galvanizing technology treatment. If further cells 71c, 71d of the same type are available, as shown in FIG. 9 for example, the treatment can be extended to all four cells with 25% treatment time each. The compensation of tolerance is further improved this way, the same with the layer thickness compensation according to the invention.

If articles are galvanized in different electrolytic baths, the connection of the rectifier to the anode rails and to the cathode rails is alternately from sides L and R corresponding to FIG. 9.

EXAMPLE

Copper bath connected like 71a in FIG. 8. A tin bath following that is connected as in 71b.

Also, because of this at least a summary compensation of the layer thicknesses occurs in the edge area of the articles in the sense of the invention.

All characteristics shown and described, as well as their combinations with each other are a part of the invention.

I claim:

1. Process for preventing differences in layer thickness during electrolytic coating of work pieces that are arranged in a row at intervals one after the other attached in a substantially longitudinal direction on at least one cathode rail or on carrier rods, said carrier rods being attached at opposite ends to cathode rails thereby forming cathode frames containing cathode carrier rods in a bath, whereby the current in the rail or in the frame runs substantially along the length of the cathode rail or carrier rods parallel to the direction of the work pieces arranged on said cathode rail or carrier rods, wherein the cathodic current is supplied to a first end or an opposite end of the cathode rail (1) or the cathodic carrier rods (63), anodic current is supplied to at least one anode rail (11) and the current supply location to said cathode rail or cathodic carrier rods is switched at least once during the electrolytic coating of the work pieces from said first end to said opposite end.

2. Process according to claim 1, wherein simultaneously to the change in the current supply location in the cathode rail (1) or the carrier rods (63) there is also a change in current supply location for the current flow to the anode rail (11).

3. Process according to any one of claims 1 or 2, wherein the current supply location to the cathode rail (1) or the carrier rods (63) and the current supply in the anode rail (11) lie at opposite ends, so that the direction of the cathodic current flow is opposite that of the anodic current flow.

4. Process according to any of claims 1 to 2, wherein the current flow in one direction is only shut off when the current flow in the opposite direction has already been switched on.

5. Process according to any one of claims 1 to 2, wherein the change in current supply location of the treatment current occurs either by way of a direct current source (26) or within a power circuit between the direct current source and the system parts, including the work pieces (3), found in one cell of a bath.

6. Process according to any one of claims 1 to 2, wherein the work pieces (3) are treated over a specified exposure time in a cell of a bath with a defined current flow direction in the cathode rail (1), or carrier rods (63) and the anode rail (11); and after that are placed in another cell of this or another bath and treated in this cell for the same exposure time with opposite current flow direction in the cathode rail (1), the carrier rods (63) and the anode rail (11).

7. Arrangement for carrying out a process for preventing differences in layer thickness during electrolytic coating of work pieces that are arranged in a row at intervals one after the other attached in a substantially longitudinal direction on at least one cathode rail or on at least one carrier rod, said carrier rods being attached at opposite ends to cathode rails thereby forming cathode frames containing the cathode carrier rod in a bath, said arrangement comprising a cathode rail (1) or a frame (64) comprising cathode rails (67, 68) and at least one carrier rod (63) attached at opposite ends thereof to said cathode rails (67, 68) having the means to attach a series of work pieces (3) that are located one after the other and at a distance (a) from each other, wherein the cathode rail (1) or the carrier rod (63) can be connected electrically at each of its opposing ends (L, R) to the negative pole of a current source and electromechanical reversing switches or electronic d.c. current source switching means are provided in order to connect the negative pole of the current source alternately to one end (L) or to the other end (R).

8. Arrangement according to claim 7 further comprising anode rails (11), wherein the ends (L, R) of anode rails (11) can be connected to the positive pole of the d.c. current source, and electromechanical reversing switches or electronic d.c. current source switching means are provided in order to connect either one end (L) or the other end (R) of the anode rails (11) to the positive pole of the d.c. current source in the same cycle with the switching change on the cathode rail (1) or the carrier rod (63).

9. Arrangement according to claim 7, wherein for each row of work pieces (3) to be treated, two cathode rails (1, 1') are provided that decrease the ohmic resistance per unit of length of the cathode rails in the direction of the current flow (with 1 from R to L; with 1' from L to R), each of these cathode rails (1, 1') having connections to the negative pole of the direct current source of each of its ends (L, R), and the work pieces (3) being connected to the two cathode rails (1, 1') via decoupling diodes (8).

10. Arrangement according to claim 9 further comprising anode rails (11), wherein the ohmic resistance per unit of length of the anode rails (11) increases in the direction of current flow in the anode rails (11).

11. Arrangement according to claim 7 wherein a double rectifier arrangement (12, 13) is provided as direct current source with electromechanical reversing switches or electronic d.c. source switching of the current supply to at least the cathode rail (1) or carrier rod (63).

12. Arrangement according to claim 11, further comprising means to maintain a continuous current flow to the cathode rail (1) or carrier rod (63) during the change of current supply location.

13. Arrangement according to claim 7 further comprising anode rails (11), wherein at least one separate single-phase bridge-connected rectifier (26; and/or 39, 40) serves as a direct current source, the outputs of which (33 to 36, 33' to 36') are connected via rectifier diodes (29 to 32, 29' to 32') to the cathode rail (1) or carrier rod (63) carrying the workpieces (3) to one side, and to the anode rails (11) on the other side.

14. Arrangement according to claim 7 further comprising at least one anode rail (11), wherein at least one separate three-phase bridge-connected rectifier with six direct current outputs is or are provided as a direct current source, whereby one negative direct current output is connected to the end (R) of the cathode rail (1) or carrier rod (63) while another negative direct current output is connected to the other end (L) of the cathode rail (1) or carrier rod (63); that corresponding positive d.c. current outputs are connected to the ends (L, R) of anode rail (11) and that the third negative direct current output of the separate three-phase bridge-connected rectifier arrangement is connected to the middle (M) of the cathode rail (1) or carrier rod (63) and the third positive output is connected to the middle (M) of the anode rail (11).

15. Arrangement according to claim 7 further comprising at least one anode rail (11), wherein at least one separate three-phase bridge-connected rectifier with eight direct current outputs is or are provided as a direct current source; whereby two outputs (46, 47) have parallel outputs (46a, 47a) because of decoupling diodes (61, 62) which simultaneously fulfill the function of rectifier diodes and that these parallel direct current outputs, namely four (46, 46a, 47, 47a), supply to the ends of the anode rail (11) and to the ends of the cathode rail (1) or carrier rod (63) and the positive outputs (46, 46a) to both ends (L) and (R) of an anode rail (11); the negative outputs (47, 47a) to both ends of the cathode rail (1) or carrier rod (63).

16. Arrangement according to claim 7, wherein for holding the work pieces (3) by carrier rods (63) of cathode frame (64), these work pieces are arranged one after the other at a distance (1) from each other in a row that runs in the direction of the carrier rods (63), that the carrier rods (63) are connected with the ends located on one side of the arrangement (R; 65) to a first cathode rail (67) and the other ends (L; 66) to a second cathode rail (68) and that the two cathode rails can be connected alternately with the negative pole of the direct current source.

17. Arrangement according to claim 7 further comprising anode rails (11), wherein at least two separate three-phase bridge-connected rectifiers (53, 54) with nine direct current outputs are provided as a direct current source, whereby one negative direct current output is connected to the end (R) of the cathode rail (1) or carrier rod (63) while another negative direct current output is connected to the other end (L) of the cathode rail (1) or carrier rod (63); that corresponding positive d.c. current outputs are connected to the ends (L, R) of front and rear anode rails (11) and that the third negative direct current output of the separate three-phase bridge-connected rectifier arrangement is connected to the middle (M) of the cathode rail (1) or carrier rod (63) and the two positive outputs are connected to the middle (M) of the anode rails (11).

18. Arrangement according to claim 7 further comprising anode rails (11), wherein at least two separate three-phase bridge-connected rectifiers (53, 54) with twelve direct current outputs are provided as a direct current source; whereby among them three outputs (46, 47, 52) have parallel outputs (46a, 47a, 52a) because of decoupling diodes (61, 61', 62, 62') which simultaneously fulfill the function of rectifier diodes and the these parallel direct current outputs, namely six (46, 46a, 47, 47a, 52, 52a) supply to the ends of the anode rails (11) and to the ends of the cathode rail (1) or carrier rod (63) and the positive outputs (46, 46a) from the first bridge-connected rectifier (53) to both ends (L) and (R) of an anode rail (11); the negative outputs (47, 47a) from the first bridge-connected rectifier, together with the corresponding negative outputs of the second bridge-connected rectifier (54) to both ends of the cathode rail (1) or carrier rod (63) and the positive outputs (52, 52a) of the second bridge-connected rectifier (54) to both ends (L) and (R) of the other anode rail (11).

* * * * *

UNITED STATES PATENT AND TRADEMARK OFFICE
CERTIFICATE OF CORRECTION

PATENT NO. : 5,558,757
DATED : September 24, 1996
INVENTOR(S) : Egon Hubel

It is certified that error appears in the above-identified patent and that said Letters Patent is hereby corrected as shown below:

Column 2, line 55, "contain" should be deleted.

Column 2, line 65, "contain" should be deleted.

Column 6, line 50, "these" should be --there--.

Column 10, Claim 7, line 66, "rods" should be --rod--.

Signed and Sealed this

Twenty-fourth Day of December, 1996

Attest:

BRUCE LEHMAN

Attesting Officer

Commissioner of Patents and Trademarks